(12) United States Patent
Thiagarajan et al.

(10) Patent No.: US 11,943,904 B2
(45) Date of Patent: Mar. 26, 2024

(54) HYBRID THERMOSYPHON WITH IMMERSION COOLED EVAPORATOR

(71) Applicant: GE Grid GmbH, Frankfurt Am Main (DE)

(72) Inventors: Naveenan Thiagarajan, Niskayuna, NY (US); Maja Harfman Todorovic, Niskayuna, NY (US); Anindya Kanti De, Karnataka (IN); Owen Jannis Samuel Schelenz, Berlin (DE)

(73) Assignee: GE Grid GmbH, Frankfurt Am Main (DE)

( * ) Notice: Subject to any disclaimer, the term of this patent is extended or adjusted under 35 U.S.C. 154(b) by 116 days.

(21) Appl. No.: 17/828,604

(22) Filed: May 31, 2022

(65) Prior Publication Data

US 2023/0389242 A1 Nov. 30, 2023

(51) Int. Cl.
*G06F 1/16* (2006.01)
*H05K 5/00* (2006.01)
*H05K 7/00* (2006.01)
*H05K 7/20* (2006.01)

(52) U.S. Cl.
CPC ..... *H05K 7/20936* (2013.01); *H05K 7/20309* (2013.01); *H05K 7/20318* (2013.01); *H05K 7/20327* (2013.01)

(58) Field of Classification Search
CPC ........... H05K 7/20936; H05K 7/20309; H05K 7/20318; H05K 7/20327
See application file for complete search history.

(56) References Cited

U.S. PATENT DOCUMENTS

| | | | | |
|---|---|---|---|---|
| 4,833,567 A | * | 5/1989 | Saaski | F28D 15/046 165/104.33 |
| 5,076,351 A | * | 12/1991 | Munekawa | F28D 15/0233 165/104.31 |
| 5,390,077 A | * | 2/1995 | Paterson | H01L 23/4093 29/890.032 |
| 6,462,949 B1 | | 10/2002 | Parish, IV et al. | |
| 6,501,654 B2 | | 12/2002 | OConnor et al. | |
| 6,976,527 B2 | * | 12/2005 | Kirshberg | F28D 15/043 165/80.4 |

(Continued)

FOREIGN PATENT DOCUMENTS

| | | |
|---|---|---|
| EP | 2667408 A2 | 11/2013 |
| EP | 3587769 A1 | 1/2020 |

*Primary Examiner* — Anthony M Haughton
(74) *Attorney, Agent, or Firm* — Armstrong Teasdale LLP

(57) ABSTRACT

A cooling system is provided. The cooling system includes a condenser configured to condense a coolant from a vapor state to a liquid state and an evaporator configured to evaporate the coolant from the liquid state to the vapor state. The evaporator defines a reservoir configured to contain a volume of the coolant in the liquid state. The cooling system further includes a vapor channel fluidly coupled to the condenser and the evaporator and configured to convey the coolant in the vapor state from the evaporator to the condenser, a liquid channel coupled to the condenser and the evaporator and configured to convey the coolant in the liquid state from the condenser to the evaporator, and a heat generating component disposed in the reservoir and immersed in the volume of the coolant in the liquid state. The heat generating component is configured to dissipate heat into the coolant.

20 Claims, 4 Drawing Sheets

(56) References Cited

U.S. PATENT DOCUMENTS

| | | | |
|---|---|---|---|
| 7,120,022 B2 | 10/2006 | Belady et al. | |
| 7,134,289 B2 | 11/2006 | Patel et al. | |
| 7,258,161 B2 | 8/2007 | Cosley et al. | |
| 7,515,415 B2 | 4/2009 | Monfarad et al. | |
| 7,556,089 B2 | 7/2009 | Bhatti et al. | |
| 7,692,926 B2 * | 4/2010 | Henderson | F28D 15/043 |
| | | | 361/679.52 |
| 7,885,074 B2 | 2/2011 | Campbell et al. | |
| 8,014,150 B2 | 9/2011 | Campbell et al. | |
| 8,184,436 B2 | 5/2012 | Campbell et al. | |
| 8,188,595 B2 * | 5/2012 | Shuja | F21V 29/74 |
| | | | 257/714 |
| 8,619,425 B2 | 12/2013 | Campbell et al. | |
| 8,981,556 B2 * | 3/2015 | Joshi | H01L 23/4735 |
| | | | 257/714 |
| 9,099,295 B2 * | 8/2015 | Kuhlmann | H01L 23/00 |
| 9,131,631 B2 * | 9/2015 | Joshi | H01L 23/4735 |
| 9,257,365 B2 * | 2/2016 | Joshi | H01L 23/4336 |
| 9,460,985 B2 * | 10/2016 | Joshi | H01L 23/4735 |
| 9,484,283 B2 * | 11/2016 | Joshi | H01L 23/4735 |
| 9,500,413 B1 | 11/2016 | Rice | |
| 10,156,385 B1 | 12/2018 | Kapsha | |
| 10,314,199 B2 | 6/2019 | Smith, III | |
| 10,321,603 B1 | 6/2019 | Banerjee et al. | |
| 2005/0082158 A1 * | 4/2005 | Wenger | F28D 15/043 |
| | | | 159/901 |
| 2007/0227703 A1 | 10/2007 | Bhatti et al. | |
| 2017/0363365 A1 | 12/2017 | Aoki et al. | |
| 2018/0246550 A1 | 8/2018 | Inaba et al. | |
| 2019/0226767 A1 | 7/2019 | Omi et al. | |
| 2020/0096260 A1 | 3/2020 | Omi et al. | |
| 2020/0254845 A1 | 8/2020 | Miura et al. | |

\* cited by examiner

US 11,943,904 B2

HYBRID THERMOSYPHON WITH IMMERSION COOLED EVAPORATOR

BACKGROUND

The field of the invention relates generally to control systems of power generation facilities, and more particularly, to ramp rate control for hybrid power generation facilities.

Electrical systems, such as inverters for solar power production facilities, generally include many heat generating components including, for example, inductors and insulated-gate bipolar transistor (IGBT) switches. These components must be cooled to a certain operating temperature to avoid issues such as safety hazards and degradation or failure of the components. Air-cooling these components may be relatively inefficient and necessitate a use of larger or redundant components to ensure that the components do not overheat, resulting in greater cost. A system that can more efficiently cool heat generating components in electrical systems is therefore desirable.

BRIEF DESCRIPTION

In one aspect, a cooling system is provided. The cooling system includes a condenser configured to condense a coolant from a vapor state to a liquid state. The cooling system further includes an evaporator configured to evaporate the coolant from the liquid state to the vapor state. The evaporator defines a reservoir configured to contain a volume of the coolant in the liquid state. The cooling system further includes a vapor channel fluidly coupled to the condenser and the evaporator and configured to convey the coolant in the vapor state from the evaporator to the condenser. The cooling system further includes a liquid channel coupled to the condenser and the evaporator and configured to convey the coolant in the liquid state from the condenser to the evaporator. The cooling system further includes a heat generating component disposed in the reservoir and immersed in the volume of the coolant in the liquid state. The heat generating component is configured to dissipate heat into the coolant.

In another aspect, a method for assembling a cooling system is provided. The method includes fluidly coupling a vapor channel to a condenser configured to condense a coolant from a vapor state to a liquid state and to an evaporator configured to evaporate the coolant from the liquid state to the vapor state, The evaporator defines a reservoir configured to contain a volume of the coolant in the liquid state. The vapor channel is configured to convey the coolant in the vapor state from the evaporator to the condenser. The method further includes fluidly coupling a liquid channel to the condenser and the evaporator. The liquid channel configured to convey the coolant in the liquid state from the condenser to the evaporator. The method further includes positioning a heat generating component in the reservoir and immersed in the volume of the coolant in the liquid state. The heat generating component configured to dissipate heat into the coolant.

In another aspect, a cooling system is provided. The cooling system includes a condenser configured to condense a coolant from a vapor state to a liquid state. The cooling system further includes an evaporator configured to evaporate the coolant from the liquid state to the vapor state, the evaporator defining a reservoir configured to contain a volume of the coolant in the liquid state and a heat generating component immersed in the volume of the coolant in the liquid state. The heat generating component is configured to dissipate heat into the coolant. The cooling system further includes a vapor channel fluidly coupled to the condenser and the evaporator and configured to convey the coolant in the vapor state from the evaporator to the condenser. The cooling system further includes a liquid channel coupled to the condenser and the evaporator and configured to convey the coolant in the liquid state from the condenser to the evaporator.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
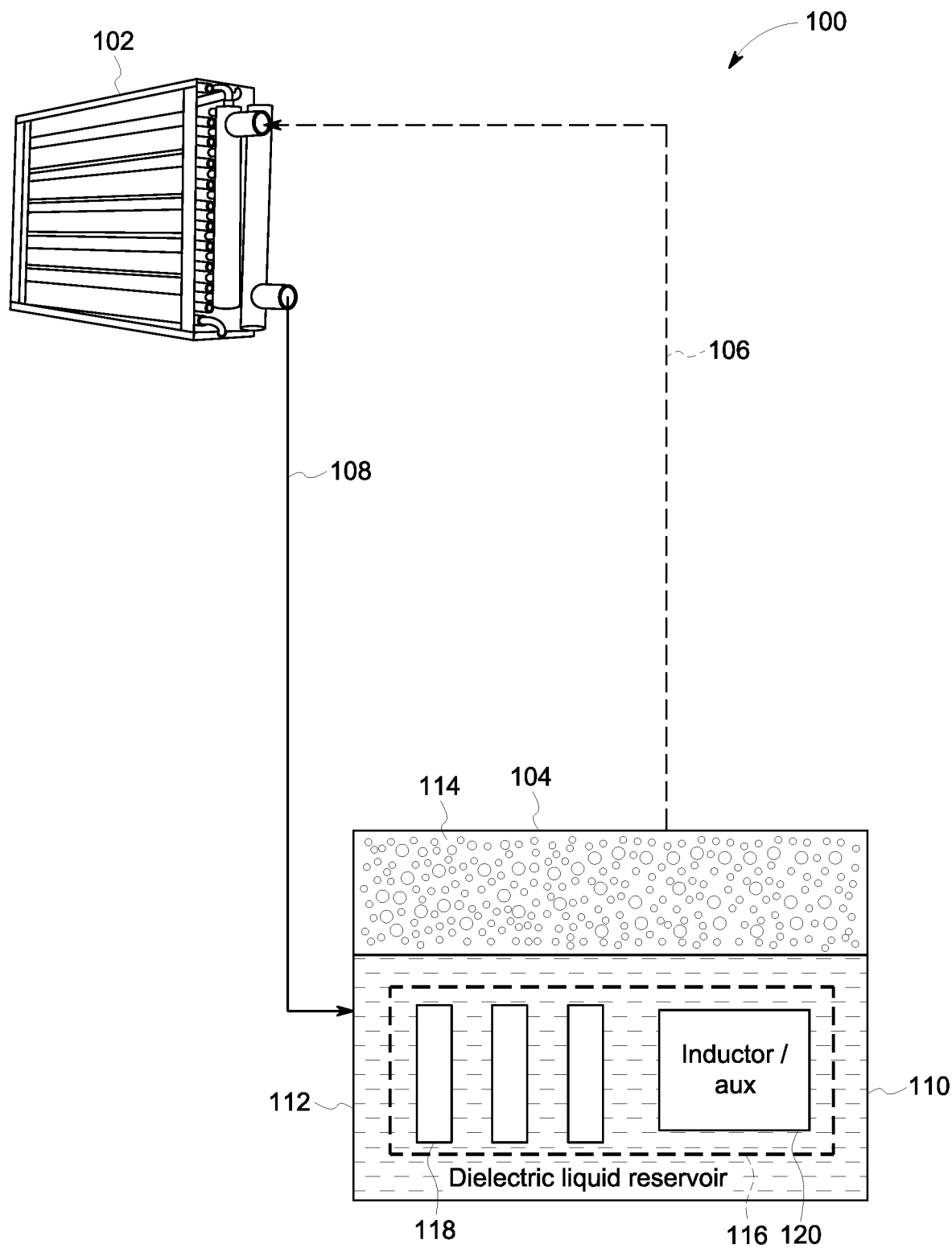
FIG. 1 is a diagram of an example cooling system.

In the following specification and the claims, reference will be made to a number of terms, which shall be defined to have the following meanings.

The singular forms "a", "an", and "the" include plural references unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about," "substantially," and "approximately," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Embodiments of the present disclosure include a thermosyphon cooling system. The cooling system includes a condenser configured to condense a coolant from a vapor state to a liquid state and an evaporator configured to evaporate the coolant from the liquid state to the vapor state. The cooling system further includes a vapor channel fluidly coupled to the condenser and the evaporator and configured to convey the coolant in the vapor state from the evaporator to the condenser, and a liquid channel coupled to the condenser and the evaporator and configured to convey the coolant in the liquid state from the condenser to the evaporator. The coolant may move passively through the cooling system due to convection and gravity.

The evaporator defines a reservoir configured to contain a volume of the coolant in the liquid state. A heat generating component is disposed in the reservoir and immersed in the volume of the coolant in the liquid state, so that the heat generating component is cooled by dissipating heat into the coolant. In certain embodiments, the cooling system may include one or more condensers and/or one or more reservoirs. The number of condensers may or may not be the same as the number of reservoirs.

In some embodiments, the cooling system may include additional cooling branches to reach additional heat generating components. For example, a branch (sometimes referred to herein as a "direct auxiliary branch") may channel liquid coolant from the reservoir to a heat generating component to cool the heat generating coolant. Additionally or alternatively, a branch (sometimes referred to herein as an "indirect auxiliary branch") may utilize a secondary coolant to cool a heat generating component. The secondary coolant may in turn be cooled by being channeled through a heat exchanger located in the reservoir. In certain such embodiments, an active fluid mover, such as a pump or blower, is used to facilitate movement of the coolant through the branch.

FIG. 1 illustrates an example cooling system 100 (sometimes referred to herein as a "thermosyphon"). Cooling system 100 includes a condenser 102, an evaporator 104, a vapor channel 106, and a liquid channel 108. Condenser 102 is configured to condense a coolant (e.g., a dielectric fluid) from a vapor state to a liquid state by cooling the coolant, and evaporator 104 is configured to evaporate the coolant from the liquid state to the vapor state by heating the coolant. Vapor channel 106 is fluidly coupled to condenser 102 and evaporator 104, and conveys the coolant in the vapor state from evaporator 104 to condenser 102. Liquid channel 108 is also fluidly coupled to condenser 102 and evaporator 104, and conveys the coolant in the liquid state from condenser 102 to evaporator 104. Accordingly, cooling system 100 facilitates a transfer of heat from evaporator 104 to condenser 102, where the heat may be dissipated to the surrounding environment. In some embodiments, condenser 102 is located at a higher elevation than evaporator 104, so that the coolant may flow between condenser 102 and evaporator 104 due to gravity without the use of active fluid moving devices, such as pumps or fans. In some embodiments, condenser 102 may further contain air and/or liquid as a secondary fluid to remove the heat from the primary thermosyphon coolant. In some such embodiments, the secondary air and/or liquid, is moved by a pump or blower through condenser 102. Alternatively, in certain embodiments, the secondary fluid movement may move without the use of a pump or blower.

Evaporator 104 defines a reservoir 110 therein, which is fluidly coupled to vapor channel 106 and liquid channel 108. Reservoir 110 contains a volume of liquid coolant 112 and a volume of vapor coolant 114. One or more heat generating components 116 are disposed at least partially within reservoir 110 and immersed in the volume of liquid coolant 112. Liquid coolant 112 may be received in reservoir 110 from liquid channel 108, where liquid coolant 112 is heated by heat generating components 116 and transitions to a vapor state (i.e., converts to vapor coolant 114), transferring heat from and cooling heat generating components 116. In certain embodiments, the coolant has a boiling point in the range of −50 to +100 degrees Celsius at atmospheric pressure and varying pressure ranges. In various embodiment, the coolant may be, but is not limited to, commercial refrigerants, water, DI water, and heat transfer fluids such as R134a, R410a, R245fa, R1233zd(3), R1234yf, 3m NOVEC 649, 3M FC 72, NOVEC 7100, NOVEC 7500.

In some embodiments, heat generating components 116 include IGBTs 118, an inductor 120, and/or other heat generating high-power electrical and electronic components. IGBTs 118 and inductor 120 may form portions of, for example, an inverter or power converter of a battery energy storage system or other power system. By using phase-change cooling, such as that facilitated by evaporator 104, IGBTs 118, inductor 120, and other heat generating components 116 may be cooled more efficiently, and accordingly may be operated at higher currents, which in turn may reduce the number of heat generating components 116 needed in a given power system and reduce the overall cost of the power system.

Figure 2:
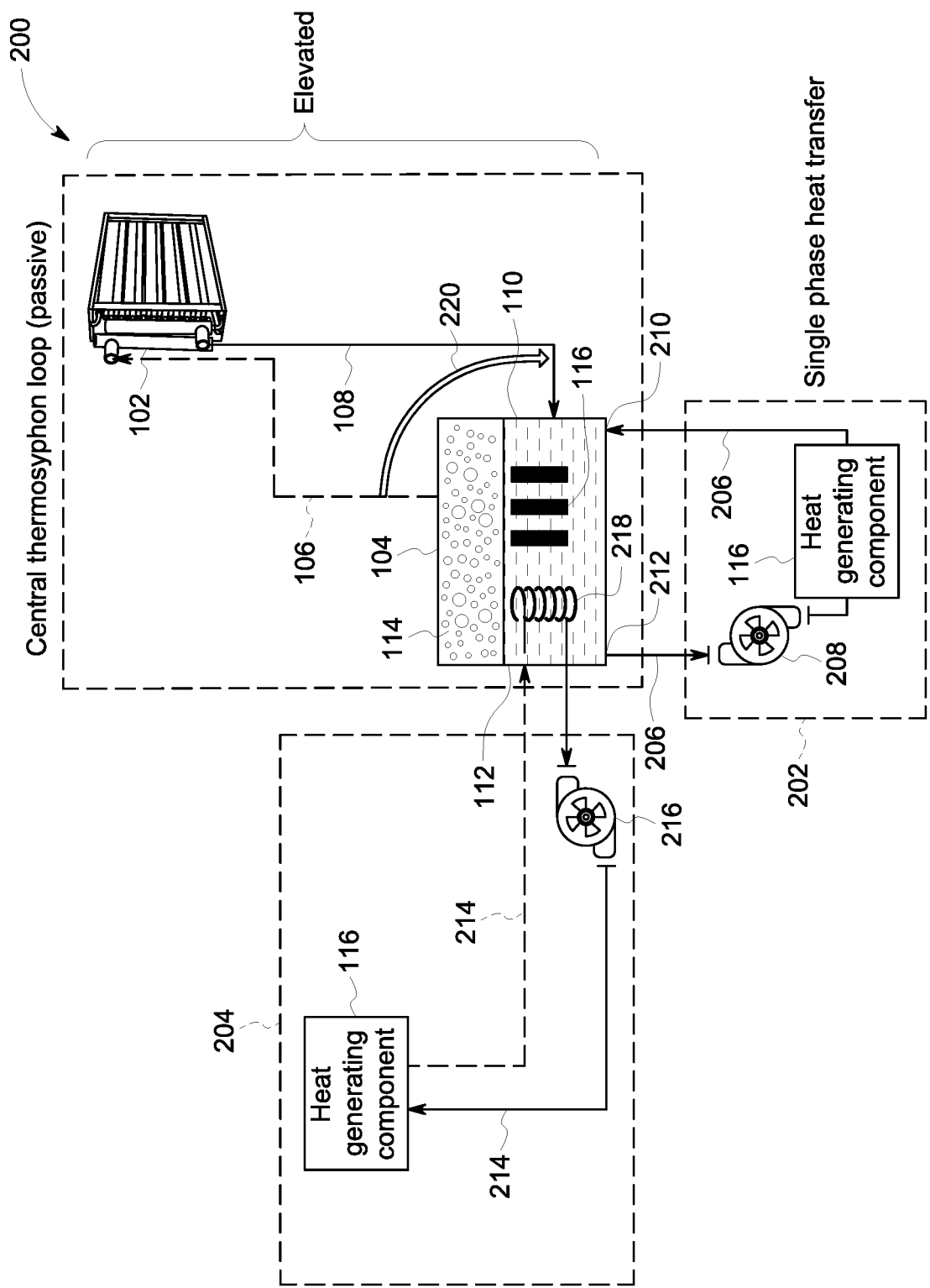
FIG. 2 is a diagram of another example cooling system.

FIG. 2 illustrates another example cooling system 200. Similar to cooling system 100 shown in FIG. 1, cooling system 200 includes condenser 102, evaporator 104, vapor channel 106, liquid channel 108, and heat generating components 116, which generally function as described with respect to FIG. 1. Cooling system 200 further includes a direct auxiliary branch 202 and an indirect auxiliary branch 204, which are used to cool additional heat generating components 116.

Direct auxiliary branch 202 includes a direct auxiliary channel 206 and a pump 208. Direct auxiliary channel 206 is fluidly coupled at an inlet 210 and an outlet 212 to reservoir 110 of evaporator 104, and is configured to receive liquid coolant 112 from reservoir 110 at outlet 212 and return liquid coolant 112. Pump 208 is configured to cause liquid coolant 112 to move through direct auxiliary channel 206 from outlet 212 to inlet 210. As liquid coolant 112 passes heat generating component 116, heat is transferred to liquid coolant 112 to cool heat generating component 116. While FIG. 2 illustrates the coolant passing through direct auxiliary channel 206 as remaining in a single state (i.e., the liquid state), in some embodiments, the coolant passing through direct auxiliary channel 206 may exist at multiple states. For example, the coolant may evaporate to the vapor state upon being heated by heat generating component 116, and may return to the liquid state before being returned to reservoir 110 through inlet 210. In some embodiments, evaporator 104 and/or direct auxiliary channel 206 includes flow control devices, such as manual or electromechanical valves and/or orifices, to control the flow within direct auxiliary channel 206.

Indirect auxiliary branch 204 includes an indirect auxiliary channel 214, a fluid mover 216, and a heat exchanger 218. Indirect auxiliary channel 214 is coupled at both ends to heat exchanger 218, which is disposed in reservoir 110 at least partially immersed in liquid coolant 112. Indirect auxiliary channel 214 is configured to convey a secondary coolant, separate from the coolant present in reservoir 110, in a loop between one or more heat generating components 116 and heat exchanger 218. Fluid mover 216 is configured to cause the secondary coolant to move through indirect auxiliary channel 214 past heat generating component 116 and on through heat exchanger 218. Fluid mover 216 may be, for example, a pump or a blower, depending on the state of the secondary coolant moving through fluid mover 216. When the secondary coolant passes heat generating component 116, heat is transferred to the second coolant to cool heat generating component 116. When the secondary coolant passes through heat exchanger 218, heat is transferred to liquid coolant 112 to cool the second coolant. In some embodiments, such as that shown in FIG. 2, heat exchanger 218 may be shaped as a coil. Alternatively, heat exchanger 218 may be any suitable shape that enables sufficient heat to be exchanged from the second coolant to liquid coolant 112, and may be disposed outside of reservoir 110 in a location where heat may be transferred to liquid coolant 112. The secondary coolant may be a single state (e.g., always liquid or always vapor), or may have multiple states. For example, the secondary coolant may evaporate to the vapor state upon being heated by heat generating component 116 and condense to the liquid state upon being cooled by liquid coolant 112.

In certain embodiments, to reduce an overall system pressure drop, each loop of cooling system that is a thermosyphon (i.e., that relies on convective fluid movement) has one or more liquid bridges 220. For example, a liquid bridge 220 is fluidly coupled between vapor channel 106 and liquid channel 108. Liquid bridge 220 serves to return any entrained liquid in vapor channel 106 back to liquid channel 108 by-passing condenser 102. In some embodiments, there is more than one liquid bridge 220 depending on the number of condensers 102 and of evaporators 104 present in cooling system 100.

Figure 3A:
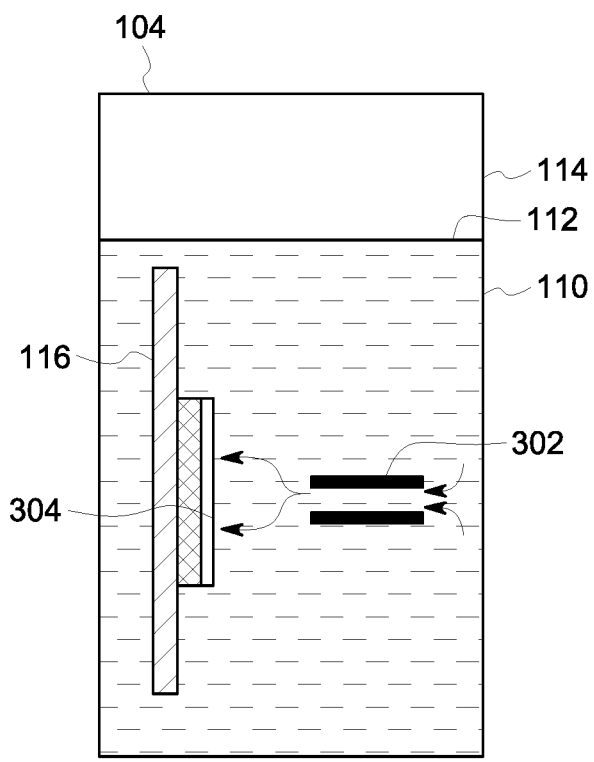
FIG. 3A is a cross-sectional view of an example evaporator for use within the cooling systems illustrated in FIGS. 1 and 2.
Figure 3B:
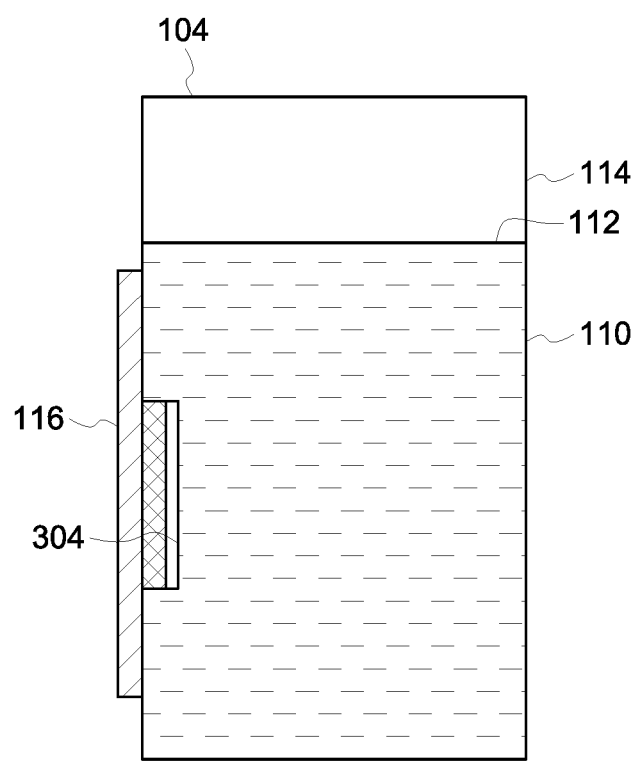
FIG. 3B is a cross-sectional view of another example evaporator for use within the cooling systems illustrated in FIGS. 1 and 2.

FIGS. 3A and 3B illustrate different configurations for positioning heat generating components 116 within reservoir 110 of evaporator 104. As shown in FIG. 3A, in some embodiments, heat generating component 116 may be disposed entirely within liquid coolant 112 contained in reservoir 110. In some such embodiments, impingement jets 302 are also positioned within liquid coolant 112 contained in reservoir 110. Impingement jets 302 are configured to direct a local flow of liquid coolant 112 towards heat generating component 116 to increase the transfer of heat from heat generating component 116 to liquid coolant 112 and enable removal of vapor, if any, away from the heat generating component 116. In certain embodiments, impingement jets 302 are passive and rely on, for example, convection to generate fluid movement towards heat generating component 116. Alternatively, impingement jets 302 may include an active fluid moving device.

In some embodiments, a surface 304 (e.g., a base plate and/or mounting plate surface) of heat generating component 116 may include microchannels that guide movement of liquid coolant 112 across surface 304 to increase transfer of heat from heat generating component 116 to liquid coolant 112. For embodiments in which impingement jets 302 are present, impingement jets 302 may be aligned such that the fluid movement generated by impingement jets 302 causes further fluid movement through the microchannels of surface 304. Surface 304 may include additional nucleating boiling enhancement features to increase critical heat flux and increase heat transfer due to boiling. For example, in some embodiments, surface 304 includes additive or conventionally fabricated mesh structures that act as nucleation sites, pitted surfaces, surfaces with drilled holes, and finned surfaces of different shapes and spacing. For example, such fins may be aligned and/or staggered, may be straight or wavy, and may have different shapes (e.g., parabolic, airfoil, pins, and/or studs). Such structures may be monolithic as part of surface 304 or separately fastened (e.g., glued, etc.) to be thermally and mechanically coupled to surface 304.

As shown in FIG. 3B, in certain embodiments, heat generating component 116 is partially disposed in reservoir 110 of evaporator 104. In such embodiments, a heated surface (e.g., surface 304) is immersed in liquid coolant 112, while other portions of heat generating component 116 are disposed externally to reservoir 110. In some implementations, immersing only certain portions of heat generating component 116 may reduce potential compatibility issues when incorporating preexisting components into cooling systems 100 and/or 200.

Figure 4:
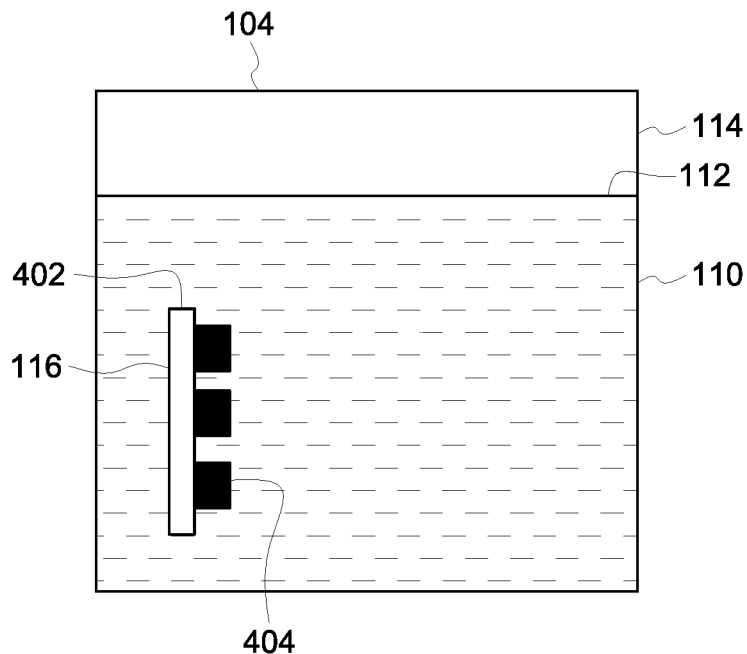
FIG. 4 is a cross-sectional view of another example evaporator for use within the cooling systems illustrated in FIGS. 1 and 2.

As shown in FIG. 4, in some embodiments, in which heat generating component 116 is immersed fully or partially in the reservoir 110 containing liquid coolant 112, heat generating component 116 does not have a traditional packaging, so that heat transfer may be improved. For example, traditional IGBT power modules have a multi-layer construction where heat generated in the active layer (e.g., a Silicon layer) must transfer through multiple packaging materials to reach a heat sink and/or coolant. As shown in FIG. 4, in some embodiments, heat generating component includes a substrate 402 and one or more active components 404 (e.g., diodes or integrated circuit (IC) chips) disposed on substrate 402 and in direct contact with liquid coolant 112. In such embodiments, heat generating components 116 include no case, epoxy encapsulation, baseplate, or other such packaging, such that the active components of heat generating component 116 is exposed directly to the coolant, improving heat transfer and reducing a cost of heat generating component 116.

Figure 5:
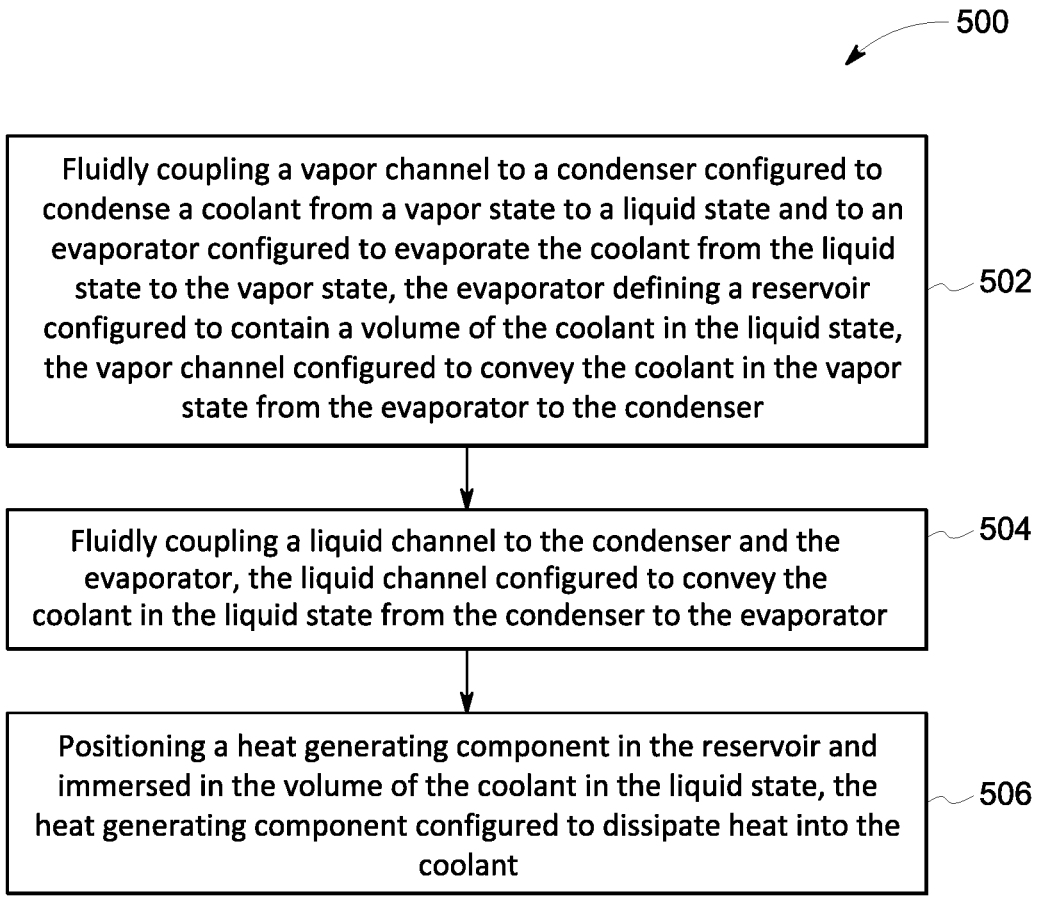
FIG. 5 is a flowchart of an example method for assembling a cooling system.

FIG. 5 is a flowchart illustrating an example method 500 for assembling a cooling system (such as cooling system 100 shown in FIG. 1). Method 500 includes fluidly coupling 502 a vapor channel (such as vapor channel 106) to a condenser (such as condenser 102) configured to condense a coolant from a vapor state to a liquid state and to an evaporator (such as evaporator 104) configured to evaporate the coolant from the liquid state to the vapor state, the evaporator defining a reservoir (such as reservoir 110) configured to contain a volume of the coolant in the liquid state. The vapor channel is configured to convey the coolant in the vapor state from the evaporator to the condenser.

Method 500 further includes fluidly coupling 504 a liquid channel (such as liquid channel 108) to the condenser and the evaporator, the liquid channel configured to convey the coolant in the liquid state from the condenser to the evaporator.

Method 500 further includes positioning 506 a heat generating component (such as heat generating component 116) in the reservoir and immersed in the volume of the coolant in the liquid state. The heat generating component is configured to dissipate heat into the coolant.

In some embodiments, method 500 further includes fluidly coupling a direct auxiliary channel (such as direct auxiliary channel 206) to the reservoir at an inlet (such as inlet 210) and an outlet (such as outlet 212). The direct auxiliary channel is configured to convey the coolant from the outlet to the inlet. In such embodiments, method 500 further includes positioning a second heat generating component to dissipate heat into the coolant moving through the direct auxiliary channel. In certain such embodiments, a pump (such as pump 208) is configured to move the coolant through the direct auxiliary channel.

In some embodiments, method 500 further includes positioning a heat exchanger (such as heat exchanger 218) in the reservoir. The heat exchanger defines a fluid path and is configured to transfer heat from a secondary coolant moving through the fluid path to the coolant in the reservoir. In such embodiments, method 500 further includes fluidly coupling an indirect auxiliary channel (such as indirect auxiliary channel 214) to each end of the fluid path of the heat exchanger. The indirect auxiliary channel is configured to convey the secondary coolant. In such embodiments, method 500 further includes positioning a second heat generating component to dissipate heat into the secondary coolant moving through the indirect auxiliary channel. In certain such embodiments, a fluid moving device (such as fluid mover 216) configured to move the secondary coolant through the indirect auxiliary channel. In some such embodiments, the heat exchanger is configured to cause the secondary coolant to change in state from a vapor to a liquid.

In certain embodiments, method 500 further includes positioning an impingement jet (such as impingement jet 302) in the reservoir. The impingement jet is configured to direct fluid movement of the coolant towards the heat generating component.

In some embodiments, method 500 further includes forming microchannels on a surface (such as surface 304) of the heat generating component. The microchannels are configured to increase a transfer of heat from the heat generating component to the coolant.

In certain embodiments, the heat generating component is entirely disposed within the reservoir of the evaporator immersed in the coolant.

In some embodiments, the heat generating component is partially disposed in the reservoir of the evaporator immersed in the coolant.

In certain embodiments, method 500 further includes fluidly coupling a liquid bridge (such as liquid bridge 220) between the vapor channel and the liquid channel.

In some embodiments, the heat generating component includes one or more active components disposed in direct contact with the coolant.

An example technical effect of the methods, systems, and apparatus described herein includes at least one of: (a) cooling a heat generating component by immersing the heat generating component within a coolant reservoir of an evaporator of a thermosyphon cooling system; (b) cooling a heat generating component by providing an channel in thermal communication with an evaporator of a thermosyphon cooling system configured to channel fluid to transfer heat from the heat generating component to the evaporator; and (c) reducing a number of heat generating components needed to implement a power system by cooling the heat generating components using a thermosyphon loop.

Example embodiments of a cooling system are provided herein. The systems and methods of operating and manufacturing such systems and devices are not limited to the specific embodiments described herein, but rather, components of systems and/or steps of the methods may be utilized independently and separately from other components and/or steps described herein. For example, the methods may also be used in combination with other electronic systems, and are not limited to practice with only the electronic systems, and methods as described herein. Rather, the example embodiments can be implemented and utilized in connection with many other electronic systems.

Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above embodiments are examples only, and thus are not intended to limit in any way the definition and/or meaning of the term processor and processing device.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:
1. A cooling system comprising:
   a condenser configured to condense a coolant from a vapor state to a liquid state;
   an evaporator configured to evaporate the coolant from the liquid state to the vapor state, said evaporator defining a reservoir configured to contain a volume of the coolant in the liquid state;
   a vapor channel fluidly coupled to said condenser and said evaporator and configured to convey the coolant in the vapor state from said evaporator to said condenser;
   a liquid channel coupled to said condenser and said evaporator and configured to convey the coolant in the liquid state from said condenser to said evaporator; and
   a heat generating component disposed in the reservoir and immersed in the volume of the coolant in the liquid state, said heat generating component configured to dissipate heat into the coolant.
2. The cooling system of claim 1, further comprising a direct auxiliary branch comprising:
   a direct auxiliary channel fluidly coupled to the reservoir at an inlet and an outlet and configured to convey the coolant from the outlet to the inlet; and
   a second heat generating component configured to dissipate heat into the coolant moving through said direct auxiliary channel.
3. The cooling system of claim 2, wherein said direct auxiliary branch further comprises a pump configured to move the coolant through said direct auxiliary channel.
4. The cooling system of claim 1, further comprising an indirect auxiliary branch comprising:
   a heat exchanger defining a fluid path, said heat exchanger disposed in the reservoir and configured to transfer heat from a secondary coolant moving through the fluid path to the coolant in the reservoir;
   an indirect auxiliary channel fluidly coupled with each end of the fluid path of said heat exchanger and configured to convey the secondary coolant; and
   a second heat generating component configured to dissipate heat into the secondary coolant moving through said indirect auxiliary channel.
5. The cooling system of claim 4, wherein said indirect auxiliary branch further comprises a fluid moving device configured to move the secondary coolant through said indirect auxiliary channel.

6. The cooling system of claim 4, wherein said heat exchanger is configured to cause the secondary coolant to change in state from a vapor to a liquid.

7. The cooling system of claim 1, further comprising an impingement jet configured to direct fluid movement of the coolant towards said heat generating component.

8. The cooling system of claim 1, wherein said heat generating component comprises a surface having microchannels configured to increase a transfer of heat from said heat generating component to the coolant.

9. The cooling system of claim 1, wherein said heat generating component is entirely disposed within the reservoir of said evaporator immersed in the coolant.

10. The cooling system of claim 1, wherein said heat generating component is partially disposed in the reservoir of said evaporator immersed in the coolant.

11. The cooling system of claim 1, further comprising a liquid bridge fluidly coupled between said vapor channel and said liquid channel.

12. The cooling system of claim 1, wherein said heat generating component comprises one or more active components disposed in direct contact with the coolant.

13. The cooling system of claim 1, further comprising at least one of a plurality of condensers and a plurality of evaporators.

14. A method for assembling a cooling system, said method comprising:
fluidly coupling a vapor channel to a condenser configured to condense a coolant from a vapor state to a liquid state and to an evaporator configured to evaporate the coolant from the liquid state to the vapor state, the evaporator defining a reservoir configured to contain a volume of the coolant in the liquid state, the vapor channel configured to convey the coolant in the vapor state from the evaporator to the condenser;
fluidly coupling a liquid channel to the condenser and the evaporator, the liquid channel configured to convey the coolant in the liquid state from the condenser to the evaporator; and
positioning a heat generating component in the reservoir and immersed in the volume of the coolant in the liquid state, the heat generating component configured to dissipate heat into the coolant.

15. The method of claim 14, further comprising:
fluidly coupling a direct auxiliary channel to the reservoir at an inlet and an outlet, the direct auxiliary channel configured to convey the coolant from the outlet to the inlet; and
positioning a second heat generating component to dissipate heat into the coolant moving through the direct auxiliary channel.

16. The method of claim 14, further comprising:
positioning a heat exchanger in the reservoir, the heat exchanger defining a fluid path and configured to transfer heat from a secondary coolant moving through the fluid path to the coolant in the reservoir;
fluidly coupling an indirect auxiliary channel to each end of the fluid path of the heat exchanger, the indirect auxiliary channel configured to convey the secondary coolant; and
positioning a second heat generating component to dissipate heat into the secondary coolant moving through the indirect auxiliary channel.

17. The method of claim 14, further comprising positioning an impingement jet in the reservoir, the impingement jet configured to direct fluid movement of the coolant towards the heat generating component.

18. The method of claim 14, further comprising forming microchannels on a surface of the heat generating component, the microchannels configured to increase a transfer of heat from the heat generating component to the coolant.

19. A cooling system comprising:
a condenser configured to condense a coolant from a vapor state to a liquid state;
an evaporator configured to evaporate the coolant from the liquid state to the vapor state, said evaporator defining a reservoir configured to contain a volume of the coolant in the liquid state and a heat generating component immersed in the volume of the coolant in the liquid state, the heat generating component configured to dissipate heat into the coolant;
a vapor channel fluidly coupled to said condenser and said evaporator and configured to convey the coolant in the vapor state from said evaporator to said condenser; and
a liquid channel coupled to said condenser and said evaporator and configured to convey the coolant in the liquid state from said condenser to said evaporator.

20. The cooling system of claim 19, further comprising a direct auxiliary branch comprising:
a direct auxiliary channel fluidly coupled to the reservoir at an inlet and an outlet and configured to convey the coolant from the outlet to the inlet to cool a second heat generating component.

* * * * *